United States Patent [19]

Zelez

[11] Patent Number: 4,603,082

[45] Date of Patent: Jul. 29, 1986

[54] DIAMOND-LIKE FILM

[75] Inventor: Joseph Zelez, Monroe County, Pa.

[73] Assignee: RCA Corporation, Princeton, N.J.

[21] Appl. No.: 728,588

[22] Filed: Apr. 29, 1985

[51] Int. Cl.$^4$ .............................................. B05D 3/06
[52] U.S. Cl. ................................ 428/336; 250/492.2; 427/38; 427/166; 428/408; 428/688
[58] Field of Search ........................ 427/35, 36, 38, 39, 427/43.1, 162, 166; 204/192 N; 250/492.1, 492.2, 492.21, 492.3; 428/408, 336, 688

[56] References Cited

U.S. PATENT DOCUMENTS

| | | |
|---|---|---|
| 3,961,103 | 6/1976 | Aisenberg .............................. 427/39 |
| 4,060,660 | 11/1977 | Carlson et al. ......................... 427/39 |
| 4,248,909 | 2/1981 | Whittaker ............................. 427/162 |
| 4,382,100 | 5/1983 | Holland ................................. 427/39 |
| 4,444,805 | 4/1984 | Corbett et al. ......................... 427/38 |
| 4,475,044 | 1/1985 | Banks .................................... 427/39 |
| 4,504,519 | 3/1985 | Zelez ..................................... 427/39 |

OTHER PUBLICATIONS

Article in Applied Optics, vol. 24, No. 4, pp. 508–512, Feb. 1985—Enke.

*Primary Examiner*—John H. Newsome
*Attorney, Agent, or Firm*—Birgit E. Morris; R. Hain Swope

[57] ABSTRACT

The optical transmission of an amorphous, carbonaceous film having diamond-like properties is enhanced by the ion implantation thereof with carbon ions. The film preferably is between about 30 and 110 nanometers in thickness and is implanted with a dosage of between about $10^{12}$ and $10^{14}$ carbon ions per square centimeter.

8 Claims, No Drawings

DIAMOND-LIKE FILM

This invention relates to improved amorphous carbonaceous, diamond-like films and a process for enhancing their optical properties.

BACKGROUND OF THE INVENTION

Amorphous, carbonaceous, diamond-like films, or films having diamond-like properties, are known. Such films are utilized, for example, as protective coatings for abrasive applications, such as coating on writing instruments, as anti-reflective coatings on a variety of substrates and as dielectric coatings for silicon or silicon-containing devices. Such films are particularly useful as coatings for optical lenses to increase their optical transmission or as coatings on mirrors to improve light reflectivity.

Amorphous, carbonaceous, diamond-like films having significantly improved properties are disclosed in my U.S. Pat. No. 4,504,519, issued Mar. 12, 1985, the disclosure of which is incorporated herein by reference. These films are characterized by markedly low stress, excellent adherence to a variety of substrates and by being extremely hard. The improved properties of these films are due, in large measure, to an extremely low hydrogen content.

SUMMARY OF THE INVENTION

In accordance with this invention, the optical transmission of certain amorphous, carbonaceous films having diamond-like properties is significantly enhanced by implanting the films with carbon.

DETAILED DESCRIPTION OF THE INVENTION

The process of this invention will be described with reference to low-hydrogen, amorphous, carbonaceous films of U.S. Pat. No 4,504,519. The process may, however, be applied to other films which have similar properties.

The preferred films are produced by the plasma decomposition of an alkane, such as n-butane, using carbon electrodes, preferably ultra pure carbon electrodes. Other alkanes such as methane, ethane, propane, hexane and the like can be utilized in the deposition process as well.

The coating is formed on a suitable substrate, e.g. a lens, in a vacuum chamber. Typically, the pure carbon electrodes are spaced at approximately 2.5 cm. The lower, substrate electrode is biased to from 0 to about $-100$ volts and the upper electrode is biased to from about $-200$ to $-2500$ volts. The chamber is evacuated to about $10^{-7}$ torr and backfilled with the alkane to about $8 \times 10^{-4}$ torr. The pressure is then adjusted to from about 10 to 100 millitorr, suitably by decreasing the pumping speed, and the plasma is initiated. The amorphous, carbonaceous, diamond-like film is deposited at from about 8 to about 124 angstroms per minute.

The films treated in accordance with this invention are thin, i.e. between about 57 and 220, preferably from about 110 to 115 nanometers in thickness. This is because, due to the extreme hardness of the film, ion implantation only penetrates to a given depth.

The substrates for deposition of these films may be of a wide variety of materials. The films described in my U.S. Pat. No. 4,504,519 are particularly advantageous in that they may be deposited on the plastics commonly used as lens materials, e.g. styrene, polycarbonates, acrylics, polytetrafluoroethylene and the like.

The films produced by the above-described process are amorphous and have an extremely low stress, i.e. in the range of about $10^7$ to $10^8$ dynes/cm$^2$. The stress may be either compressive or tensile depending on the potential applied to the upper or nonsubstrate carbon electrode during deposition. The films are further characterized by an uncommonly low hydrogen content, i.e. preferably not more than about one atomic percent.

Carbonaceous, diamond-like films are ion implanted with carbon in accordance with this invention utilizing conventional equipment, i.e. an ion accelerator. Typically, the film is implanted at an energy level of between about 8 and 200 KeV, preferably about 30 KeV, to achieve an areal dosage of between about $10^{12}$ ions/cm$^2$ and about $10^{14}$ ions/cm$^2$, preferably from about $5 \times 10^{12}$ to $1 \times 10^{13}$ ions/cm$^2$.

The mechanism whereby carbon ion implantation increases the optical transmission of amorphous, carbonaceous, diamond-like films in accordance with this invention is not known. The change in optical transmission, which amounts to as much as about 3 percent, is significant where the transmission of the nonimplanted film approaches 100 percent. The change is also significant when the diamond-like film is utilized to protect the lens of a powerful laser wherein even a change of one percent in transmission could produce a transmission increase of hundreds of watts. The effect of the ion implantation process of this invention can be observed in the visible and infrared transmission spectra, i.e. in the wavelength range between about 0.26 to 10.6 micrometers. The increase in optical transmission achieved in accordance with this invention is surprising as it was not expected that implanting a carbonaceous film with additional carbon would have a positive effect on its optical properties.

Ion implantation of amorphous, carbonaceous, diamond-like films in accordance with this invention materially reduces the etch rate of the film in certain plasmas. For example, the etch rate of an implanted film can be as low as half that of the nonimplanted film utilizing an etch mixture of, on a volume basis, 20:80 argon and hydrogen or 95:5 carbon tetrafluoride and hydrogen. The reduction in etch rate is significant when the implanted film must be patterned because the films are extremely thin. Enhanced control over the etching process minimizes any damage to the underlying substrate.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

An amorphous, carbonaceous, diamond-like film was deposited to a thickness of 75 nanometers onto transparent quartz substrates 2.54 cm square in a stainless steel deposition chamber. The substrates were placed on the lower of two ultra pure carbon electrodes horizontally positioned approximately 6 centimeters apart. The lower electrode was maintained at a potential of $-50$ volts and the upper electrode at $-500$ volts. The chamber was stabilized at a deposition pressure of 50 millitorr of n-butane.

The film was deposited by radio frequency plasma deposition at the rate of approximately 1 nanometer per minute. The stress of the film was determined to be about $7 \times 10^8$ dynes/cm$^2$ tensile stress. The resultant film had a hydrogen content of less than 1 atomic percent.

Utilizing a commercial ion accelerator, the film on one of the substrates was ion implanted with carbon ions at 30 KeV to an areal dosage of $1 \times 10^{14}$ ions/cm$^2$. Utilizing a Cary Spectrophotometer, the optical characteristics of the implanted film and a nonimplanted film were determined over the range of 400 nm to 800 nm. The results are given in Table I.

TABLE I

| Wavelength (nanometers) | Absorbance | Percent Reflectance | Percent Transmission |
|---|---|---|---|
| Implanted | | | |
| 800 | — | 13 | 87 |
| 750 | 6 | 17 | 77 |
| 700 | 18 | 9 | 73 |
| 650 | 20 | 13 | 67 |
| 600 | 38 | 9 | 53 |
| 550 | 53 | 8 | 39 |
| 500 | 70 | 9 | 21 |
| 450 | 83 | 9 | 8 |
| 400 | 87 | 11 | 2 |
| Average | 42 | 11 | 47 |
| Not Implanted | | | |
| 800 | 8 | 9 | 83 |
| 750 | 11 | 15 | 74 |
| 700 | 19 | 12 | 69 |
| 650 | 30 | 6 | 64 |
| 600 | 42 | 10 | 48 |
| 550 | 63 | 5 | 32 |
| 500 | 77 | 6 | 17 |
| 450 | 89 | 6 | 5 |
| 400 | 94 | 6 | — |
| Average | 48 | 8 | 44 |

These results clearly show an improvement in the optical properties of the film as a result of the ion implantation, particularly at the higher wavelengths.

EXAMPLE 2

Substrates were coated with a carbonaceous, diamond-like film in the manner described in Example 1 to a thickness of 2.5 micrometers. The optical properties of such films implanted, as in Example 1, and nonimplanted are given in Table II.

TABLE II

| Wavelength (nanometers) | Absorbance | Percent Reflectance | Percent Transmission |
|---|---|---|---|
| Implanted | | | |
| 800 | 31 | 15 | 54 |
| 750 | 47 | 9 | 44 |
| 700 | 58 | 11 | 31 |
| 650 | 70 | 11 | 19 |
| 600 | 78 | 11 | 8 |
| 550 | 86 | 10 | 4 |
| 500 | 89 | 10 | 1 |
| 450 | 89 | 11 | 0 |
| 400 | 89 | 11 | 0 |
| Average | 71 | 11 | 18 |
| Not Implanted | | | |
| 800 | 33 | 17 | 50 |
| 750 | 46 | 9 | 45 |
| 700 | 60 | 10 | 30 |
| 650 | 71 | 10 | 19 |
| 600 | 83 | 10 | 7 |
| 550 | 88 | 10 | 2 |
| 500 | 90 | 10 | 0 |
| 450 | 90 | 10 | 0 |
| 400 | 90 | 10 | 0 |
| Average | 72 | 11 | 17 |

These results indicate that, as the thickness of the film is increased, the improvement in transmission is decreased, even at the higher wavelengths. This further indicates that ion implantation, at the conditions given herein, only penetrates to a certain depth in the film.

EXAMPLE 3

Carbonaceous, diamond-like films approximately 115 nanometers thick implanted with $1 \times 10^{14}$/cm$^2$ carbon ions at 30 KeV were tested to determine the effect of biasing the film on optical transmission. The results are given in Table III. For purposes of brevity, only percent absorbance (designed "A") and percent transmission (designated "T") are given.

TABLE III

| Wavelength (nanometers) | no bias A | no bias T | −25 V bias A | −25 V bias T | −100 V bias A | −100 V bias T |
|---|---|---|---|---|---|---|
| Implanted | | | | | | |
| 800 | — | 87 | — | 86 | — | 85 |
| 750 | — | 87 | — | 87 | — | 84 |
| 700 | — | 87 | — | 88 | — | 84 |
| 650 | — | 87 | 1 | 87 | — | 83 |
| 600 | — | 87 | 2 | 88 | 1 | 82 |
| 550 | — | 88 | 5 | 87 | 2 | 82 |
| 500 | 3 | 87 | 9 | 89 | 6 | 80 |
| 450 | 7 | 85 | 17 | 73 | 13 | 77 |
| 400 | 18 | 75 | 30 | 57 | 36 | 67 |
| Average | 2 | 86 | 8 | 77 | 13 | 72 |
| Not Implanted | | | | | | |
| 800 | — | 88 | — | 86 | — | 85 |
| 750 | — | 88 | — | 87 | — | 84 |
| 700 | — | 88 | — | 88 | — | 84 |
| 650 | — | 88 | — | 88 | — | 83 |
| 600 | — | 88 | 1 | 89 | — | 83 |
| 550 | — | 88 | 4 | 88 | 2 | 82 |
| 500 | 2 | 88 | 10 | 83 | 5 | 81 |
| 450 | 6 | 86 | 5 | 86 | 11 | 78 |
| 400 | 16 | 77 | 11 | 76 | 22 | 70 |
| Average | 2 | 87 | 3 | 86 | 4 | 81 |

It is evident from these results that applying a bias to the film has an adverse effect on its tramsmission and that the effect of the bias is more pronounced with the implanted film than the nonimplanted film.

EXAMPLE 4

In order to demonstrate the combined effect of biasing a film and increasing the implant dosage, films 220 nm thick and implanted with $1 \times 10^{15}$ ions/cm$^2$ and $5 \times 10^{15}$ ions/cm$^2$ were tested and compared against a nonimplanted control film. All films were biased at −50 volts. The results are given in Table IV wherein the designations are as in Table III.

TABLE IV

| Wavelength (nanometers) | Dosage (ions/cm$^2$) None A | None R | $1 \times 10^{15}$ A | $1 \times 10^{15}$ R | $5 \times 10^{15}$ A | $5 \times 10^{15}$ R |
|---|---|---|---|---|---|---|
| 800 | — | 91 | — | 86 | 16 | 59 |
| 750 | — | 90 | 1 | 84 | 17 | 58 |
| 700 | — | 89 | 3 | 82 | 24 | 53 |
| 650 | — | 88 | 4 | 80 | 31 | 49 |
| 600 | — | 88 | 8 | 77 | 38 | 44 |
| 550 | 1 | 88 | 14 | 74 | 46 | 38 |
| 500 | 4 | 88 | 25 | 66 | 57 | 30 |

TABLE IV-continued

| Wavelength | Dosage (ions/cm²) | | | | | |
|---|---|---|---|---|---|---|
| | None | | $1 \times 10^{15}$ | | $5 \times 10^{15}$ | |
| (nanometers) | A | R | A | R | A | R |
| 450 | 9 | 82 | 39 | 52 | 63 | 24 |
| 400 | 20 | 67 | 52 | 35 | 73 | 14 |
| Average | 3 | 86 | 17 | 71 | 41 | 41 |

These results demonstrate the adverse effect of increasing the implant dosage above $1 \times 10^{15}$ ions/cm². The results also show that this adverse effect is enhanced by biasing the film.

EXAMPLE 5

In order to demonstrate the effect of film thickness and implant dosage on optical transmission, films 110 and 220 nanometers thick, respectively, were tested nonimplanted and with dosages of $1 \times 10^{12}$ ions/cm² and $1 \times 10^{13}$ ions/cm². The results are given in Table V. All films were unbiased.

TABLE V

| Wavelength | Dosage (ions/cm²) | | | | | |
|---|---|---|---|---|---|---|
| | None | | $1 \times 10^{12}$ | | $1 \times 10^{13}$ | |
| (nanometers) | A | R | A | R | A | R |
| 110 nm thick film | | | | | | |
| 800 | — | 88 | — | 88 | — | 88 |
| 750 | — | 89 | — | 89 | — | 89 |
| 700 | — | 90 | — | 91 | — | 91 |
| 650 | — | 91 | — | 92 | — | 92 |
| 600 | 2 | 90 | — | 92 | — | 92 |
| 550 | 2 | 87 | 1 | 88 | 1 | 88 |
| 500 | 4 | 83 | 3 | 84 | 2 | 84 |
| 450 | 8 | 82 | 8 | 83 | 8 | 82 |
| 400 | 29 | 69 | 21 | 70 | 19 | 72 |
| Average | 5 | 85 | 2 | 87 | 2 | 87 |
| 220 nm thick film | | | | | | |
| 800 | 2 | 83 | — | 86 | — | 85 |
| 750 | 1 | 84 | — | 86 | — | 85 |
| 700 | 2 | 85 | — | 88 | 1 | 85 |
| 650 | 5 | 85 | — | 90 | 2 | 87 |
| 600 | 5 | 87 | 3 | 89 | 4 | 88 |
| 550 | 9 | 80 | 6 | 84 | 7 | 83 |
| 500 | 17 | 69 | 14 | 72 | 13 | 73 |
| 450 | 31 | 59 | 31 | 60 | 27 | 62 |
| 400 | 51 | 41 | 51 | 43 | 50 | 43 |
| Average | 13 | 75 | 10 | 78 | 11 | 77 |

These results indicate that both the film thickness and implant dosage are controlling on the beneficial results obtained with the present process.

EXAMPLE 6

Films 220 nm thick implanted with $1 \times 10^{15}$ ions/cm² of carbon were plasma etched in a conventional apparatus. A number of etch gas mixtures were tested. The pressure in all instances was 10 mtorr. The results are given in Table VI, utilizing nonimplanted wafers as controls.

TABLE VI

| Etch gas mixture | | Etch Rate (Angstroms/minute) | |
|---|---|---|---|
| (ratio by volume) | | Not Implanted | Implanted |
| Argon/Hydrogen | (70:30) | 70 | 67 |
| Argon/Hydrogen | (60:40) | 68 | 50 |
| Argon/Hydrogen | (50:50) | 68 | 17 |
| Argon/Hydrogen | (40:60) | 33 | 28 |
| Argon/Hydrogen | (20:80) | 10 | 17 |
| Argon/carbon tetrafluoride | (60:40) | 135 | 125 |
| Carbon tetrafluoride/oxygen | (60:40) | 67 | 62 |
| Carbon tetrafluoride/Hydrogen | (95:5) | 107 | 88 |
| Oxygen | | 567 | 280 |
| Carbon Tetrafluoride | | 143 | 133 |

It can be seen from these results that implanting amorphous carbonaceous films in accordance with this invention has a substantial lessening effect on the etch rate thereof in certain plasmas, such as pure oxygen.

I claim:

1. A process for enhancing the optical transmission of an amorphous, carbonaceous film having diamond-like properties, said process consisting of ion implanting said film with carbon ions.

2. A process in accordance with claim 1, wherein said film has a hydrogen content of not more than about one atomic percent, and a stress below about $10^{10}$ dynes per square centimeter.

3. A process in accordance with claim 1, wherein the film is between about 57 and 220 nanometers in thickness.

4. A process in accordance with claim 3, wherein the film is between about 110 and 115 nanometers in thickness.

5. A process in accordance with claim 1, wherein the film is implanted with an areal dosage of between about $10^{12}$ and $10^{14}$ per square centimeter.

6. An article of manufacture comprising a transparent substrate having deposited thereon an amorphous carbonaceous film having diamond-like properties, said film being ion implanted with between about $5 \times 10^{12}$ and $1 \times 10^{13}$ carbon ions per square centimeter.

7. An article of manufacture in accordance with claim 6, wherein said film has a hydrogen content of not more than about one atomic percent and a stress below about $10^{10}$ dynes per square centimeter.

8. An article of manufacture in accordance with claim 6, wherein said film is between about 57 and 220 nanometers in thickness.

* * * * *